(12) United States Patent
Ahlf et al.

(10) Patent No.: US 11,639,549 B2
(45) Date of Patent: May 2, 2023

(54) PROCESS FOR PRODUCING ORGANIC-INORGANIC LAMINATES

(71) Applicant: BASF Coatings GmbH, Muenster (DE)

(72) Inventors: Maraike Ahlf, Schriesheim (DE); Felix Eickemeyer, Heidelberg (DE); Stephan Klotz, Dornach (CH)

(73) Assignee: BASF COATINGS GMBH, Muenster (DE)

( * ) Notice: Subject to any disclaimer, the term of this patent is extended or adjusted under 35 U.S.C. 154(b) by 370 days.

(21) Appl. No.: 15/317,594

(22) PCT Filed: May 7, 2015

(86) PCT No.: PCT/EP2015/060049
§ 371 (c)(1),
(2) Date: Dec. 9, 2016

(87) PCT Pub. No.: WO2015/188990
PCT Pub. Date: Dec. 17, 2015

(65) Prior Publication Data
US 2017/0121817 A1    May 4, 2017

(30) Foreign Application Priority Data
Jun. 13, 2014 (EP) .................................. 14172353

(51) Int. Cl.
*C23C 16/455* (2006.01)
*C23C 16/54* (2006.01)

(52) U.S. Cl.
CPC .. *C23C 16/45529* (2013.01); *C23C 16/45551* (2013.01); *C23C 16/545* (2013.01)

(58) Field of Classification Search
None
See application file for complete search history.

(56) References Cited

U.S. PATENT DOCUMENTS

| | | | |
|---|---|---|---|
| 9,297,077 B2* | 3/2016 | Vermeer | ........... H01L 21/67784 |
| 2003/0203210 A1* | 10/2003 | Graff | ................... H01L 51/0097 |
| | | | 428/412 |
| 2005/0214556 A1* | 9/2005 | Nishimi | .................... C08K 3/01 |
| | | | 428/500 |

(Continued)

FOREIGN PATENT DOCUMENTS

| EP | 2 360 293 A1 | 8/2011 |
|---|---|---|
| WO | WO 2009/002892 A1 | 12/2008 |

(Continued)

OTHER PUBLICATIONS

International Search Report dated Dec. 10, 2015, in PCT/EP2015/060049 filed May 7, 2015.

*Primary Examiner* — Mandy C Louie
(74) *Attorney, Agent, or Firm* — Armstrong Teasdale LLP

(57) ABSTRACT

The present invention is in the field of processes for producing organic-inorganic laminates by atomic layer deposition. In particular the present invention relates to a process for producing a laminate comprising moving a substrate relative to at least two separate orifices arranged along the relative moving trajectory wherein through at least one orifice an organic compound in the gaseous state is passed towards the surface of the substrate and through at least one other orifice a (semi)metal-containing compound in the gaseous state is passed towards the surface of the substrate and wherein the orifices are mounted on a rotating drum.

16 Claims, 1 Drawing Sheet

(56) References Cited

U.S. PATENT DOCUMENTS

| | | | |
|---|---|---|---|
| 2008/0305359 A1* | 12/2008 | Aiba | C09D 4/00 428/689 |
| 2009/0081883 A1 | 3/2009 | Freeman et al. | |
| 2010/0178481 A1* | 7/2010 | George | C23C 28/00 428/213 |
| 2011/0059234 A1* | 3/2011 | Byun | C23C 18/08 427/125 |
| 2011/0076421 A1* | 3/2011 | Lee | C23C 16/045 427/569 |
| 2013/0064977 A1 | 3/2013 | Vermeer et al. | |
| 2013/0337259 A1* | 12/2013 | Carcia | C09D 5/00 428/336 |
| 2014/0077197 A1* | 3/2014 | Toyoda | H01L 51/5253 257/40 |
| 2014/0106151 A1* | 4/2014 | Mori | B32B 27/302 428/216 |
| 2014/0322527 A1* | 10/2014 | Cho | C23C 16/44 427/255.6 |
| 2015/0086715 A1* | 3/2015 | Knaapen | C23C 16/45589 427/255.7 |
| 2015/0136028 A1* | 5/2015 | Park | C23C 16/45551 118/730 |
| 2016/0088756 A1* | 3/2016 | Ramadas | H01L 51/5259 361/728 |
| 2018/0187306 A1* | 7/2018 | Ahlf | C23C 28/00 |

FOREIGN PATENT DOCUMENTS

| | | |
|---|---|---|
| WO | WO 2011/099858 A1 | 8/2011 |
| WO | WO 2012/050442 A1 | 4/2012 |

* cited by examiner

PROCESS FOR PRODUCING ORGANIC-INORGANIC LAMINATES

BACKGROUND

The present invention is in the field of processes for producing organic-inorganic laminates by atomic layer deposition.

Laminate structures are attractive materials as they combine antagonistic properties such as flexibility of a polymeric film with the barrier characteristics of a ceramic. For packaging, encapsulation or passivation it is advantageous to provide large area flexible laminates. These laminates need to have a high diffusion barrier for small molecules like water with a high uniformity over the whole area.

WO 2011/099 858 A1 discloses a process for depositing inorganic layers on a substrate by moving a precursor-gas supply along a substrate.

WO 2012/050 442 A1 discloses a process for depositing inorganic layers on a substrate by rotating a substrate under a precursor-gas supply.

US 2009/0 081 883 A1 discloses a process for making an organic thin film on a substrate by directing a series of gas flows along substantially parallel elongated channels. However, this process renders barrier films of insufficient quality at high production speed.

It was an object of the present invention to provide a process for producing large area laminates at a high speed and with high uniformity. It was further aimed at providing a process for producing laminates which are flexible and which possess a high diffusion barrier against small molecules. These laminates were targeted to retain their barrier properties upon bending, in particular around small radii.

These objects were achieved by a process for producing a laminate comprising moving a substrate relative to at least two separate orifices arranged along the relative moving trajectory wherein through at least one orifice an organic compound in the gaseous state is passed towards the surface of the substrate and through at least one other orifice a (semi)metal-containing compound in the gaseous state is passed towards the surface of the substrate and wherein the orifices are mounted on a rotating drum.

Preferred embodiments of the present invention can be found in the description and the claims. Combinations of different embodiments fall within the scope of the current invention.

DETAILED DESCRIPTION

Figure 1:
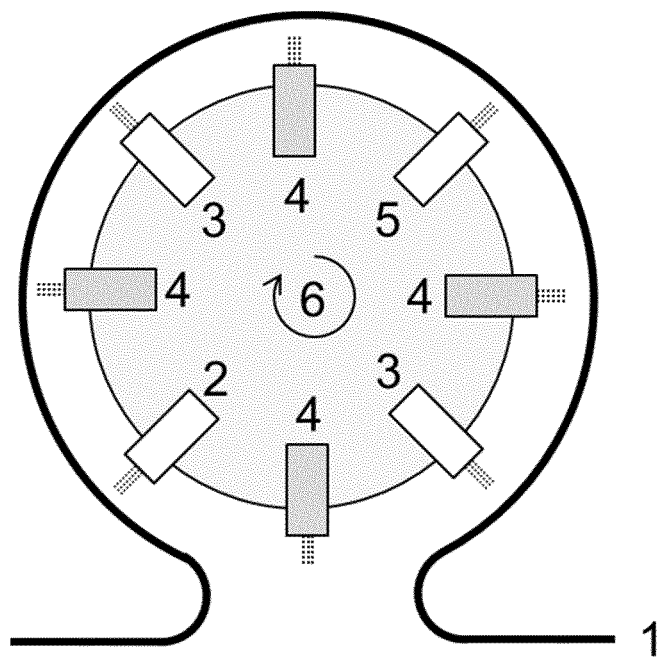
FIG. 1 illustrates an example setup including several orifices mounted on a rotating drum.

A laminate in the context of the present invention is a product in which at least two layers of a different chemical composition are in close contact to each other. Unless indicated otherwise, there is generally no particular restriction to the size, the composition of each layer, or the strength with which the layers are held together.

Inorganic in the context of the present invention refers to materials which contain at least 1 wt.-% of at least one (semi)metal, preferably at least 2 wt.-%, more preferably at least 5 wt.-%, in particular at least 10 wt.-%. The term "(semi)metal" thereby stands for "metal or semimetal". Organic in the context of the present invention refers to materials which contain more than 99 wt.-% of nonmetals, preferably more than 99.5 wt.-%, in particular completely or essentially completely. It is even more preferable that the nonmetals are C, H, O, N, S, Se and/or P. The process according to the present invention comprises moving a substrate relative to at least two separate orifices arranged along the relative moving trajectory. The relative motion can mean that the orifices are moved while the substrate is kept immobile. Alternatively, it can mean that the substrate is moved while the orifices are kept immobile. It is also possible that both the substrate and the orifices are moved with the provision that there is a relative motion between the substrate and the orifices. The motion can be linear, circular or follow any complex trajectory, for example that of a 2D plotter.

The relative motion of the orifices to the substrate can take place at various speeds depending on the substances used and required quality of the films. Preferably the speed of motion is from 0.01 to 10 m/s, more preferably 0.02 to 1 m/s, in particular 0.05 to 0.3 m/s.

According to the present invention the orifice can have any shape, for example a round hole, a square hole or a rectangular slit. The orifice can also be a nozzle with or without fixtures and fittings. Separate orifices means that no mixing of the compounds passed through two orifices occurs before reaching the surface of the substrate. This means that two or more separate orifices can be in one single part as long as this part separates the compounds before they reach the surface of the substrate.

According to the present invention the at least two separate orifices are arranged along the relative moving trajectory. This means that any point on the surface of the substrate is first hit by the compound passed through one orifice and subsequently by the compound pass through a different orifice. This can be realized by arranging the orifices in a line which equals the relative moving trajectory. It is also possible to slightly deviate from this line. In the case of rectangular orifices it is conceivable that the orifices are staggered along the trajectory wherein the longer side of the rectangles forms an angle with the relative moving trajectory of more or less than 90°.

In the process according to the present invention an organic compound in the gaseous state is passed through at least one orifice. An organic compound can be a single organic compound or a mixture of several different organic compounds. It is within the scope of the present invention that a mixture of one or more organic compounds with other compounds in the gaseous state, e.g. an inert carrier gas, are passed through at least one orifice. Any organic compound which can be brought into the gaseous state is suitable. Preferably the organic compound has a vapor pressure of at least 1 mbar at 100° C. The organic compound preferably has a hydroxy functionality, i.e. is an alcohol. More preferably the organic compound contains sulfur, in particular a thiol group. It is even more preferable that the organic compound is a thiophenol derivative. Some preferred examples for organic compounds are given below.

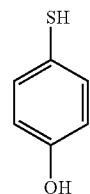

C-1

| | |
|---|---|
| C-2 | C-8 |
| C-3 | C-9 |
| C-4 | C-10 |
| C-5 | C-11 |
| C-6 | C-12 |
| C-7 | |

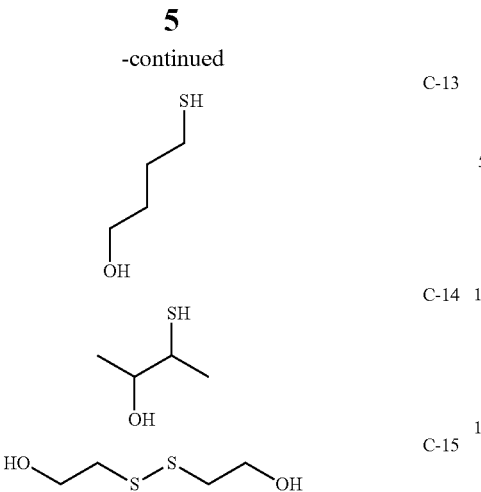

Particularly preferred are 4-mercaptophenol (C-1) and 4-mercapotbenzylic alcohol (C-2). In the case that a mixture of different organic compounds is passed through one orifice, preferably at least one of these organic compounds is a thiol.

In the process according to the present invention a (semi)metal-containing compound in the gaseous state is passed through at least one orifice. A (semi)metal-containing compound can be a single (semi)metal-containing compound or a mixture of several different (semi)metal-containing compounds. It is within the scope of the present invention that a mixture of one or more (semi)metal-containing compounds with other compounds in the gaseous state, e.g. an inert carrier gas, is passed through at least one orifice. Metals in the metal-containing compound include alkaline metals such as Li, Na, K, Rb, Cs; alkaline earth metals like Be, Mg, Ca, Sr, Ba; main group metals like Al, Ga, In, Sn, Tl, Bi; transition metals like Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg; and lanthanides like La, Ce, Pr, Nd, Pm, Sm, Eu, Gd, Tb, Dy, Ho, Er, Tm, Yb, Lu. Semimetals in the semimetal-containing compound are B, Si, As, Ge, Sb. Preferred (semi)metals are B, Al, Si, Ti, Zn, Y, Zr, La, in particular Al.

Any (semi)metal-containing compound which can be brought into the gaseous state is suitable. Preferably, the (semi)metal-containing compound is a (semi)metal organic compound. These compounds include alkyl (semi)metals such as dimethyl zinc, trimethylaluminum or dibutyl tin; (semi)metal alkoxylates such as tetramethyl silicon or tetraisopropoxy zirconium; cyclopentadiene adducts like ferrocene or titanocene; (semi)metal carbenes such as tantalumpentaneopentylat or bisimidazolidinylenrutheniumchloride; (semi)metal halogenides such as germanium tetrabromide or titanium tetrachloride; carbon monoxide complexes like chromium hexacarbonyl or nickel tetracarbonyl. More preferably, the (semi)metal-containing compound is an alkyl (semi)metal, in particular a $C_1$ to $C_4$ alkyl (semi)metal.

According to the present invention the organic compound and the (semi)metal-containing compound are brought into the gaseous state separate from each other before being passed through their respective orifice. Preferably, this is done by heating a reservoir of the organic compound or the (semi)metal-containing compound to a temperature at which its vapor pressure is at least 1 mbar.

Preferably the organic compound or the (semi)metal-containing compound in the gaseous state are mixed with an inert gas such as nitrogen or argon before being passed through the orifices. The organic compound or the (semi)metal is preferably passed through the respective orifice at a flow rate of 1 to 100 sccm, more preferably of 20 to 60 sccm. The unit sccm stands for standard cubic centimeter per minute ($cm^3$ $min^{-1}$) at 273 K and atmospheric pressure. The inert gas which is optionally mixed with the organic compound or the (semi)metal-containing compound in the gaseous state is preferably passed through the orifice at a flow rate of 100 to 2000 sccm, more preferably of 300 to 1600 sccm.

In the case that a mixture of more than one (semi)metal-containing compound is passed through one orifice inorganic layers are produced comprising for example mixed (semi)metal oxides such as tin-zinc oxide or barium-titanium oxides.

Preferably, a mixture of two different (semi)metal-containing compounds in a molar ratio of 1:99 to 30:70, more preferably in a molar ratio of 2:98 to 15:85 is passed through one orifice. In this case, (semi)metal-doped inorganic layers are accessible, for example aluminum-doped zinc oxide, tin-doped indium oxide, or antimony-doped tin oxide. Alternatively, in order to obtain halogen-doped inorganic layers it is possible to use a halogen-containing (semi)metal-containing compound or a halogen comprising compound in addition to the (semi)metal-containing compound preferably in an amount of 1 to 30 mol-% with respect to the total molar amount of (semi)metal-containing compound and halogen-comprising compound, more preferably of 2 to 15 mol-%. Examples for such halogen comprising compounds are chlorine gas, ammonium fluoride or tin tetrachloride.

According to the present invention the substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Polymers are preferred. Polymers include polyesters such as polyethylene terephthalate (PET) or polyethylene naphthalene-dicarboxylic acid (PEN); polyimides; polyacrylates such as poly methyl methacrylate (PMMA); polyacrylamides; polycarbonates such as poly(bisphenol A carbonate); polyvinylalcohol and its derivatives like polyvinyl acetate or polyvinyl butyral; polyvinylchloride; polyolefins such as polyethylene (PE) or polypropylene (PP); polycycloolefins such as polynorbornene; polyethersulphone; polyamides like polycaprolactam or poly(hexamethylene adipic amide); cellulose derivatives such as hydroxyethyl cellulose, hydroxypropyl cellulose, methyl cellulose, methyl hydroxylpropyl cellulose or nitrocellulose; polyurethanes; epoxy resins; melamine formaldehyde resins; phenol formaldehyde resins. Polymers include copolymers such as poly(ethylene-co-norbornene) or poly(ethylene-co-vinylacetate). Polyesters and polycycloolefins are preferred.

The substrate can have any size and shape. Preferably the substrate is a film, more preferably a polymer film. The thickness of the substrate film depends on the application. If the film needs to be flexible and bent around a radius of more than 10 mm, the substrate film preferably has a thickness of 100 to 1000 μm, more preferably 100 to 500 μm, for example 100 to 200 μm. If the film needs to be flexible and bent around a radius of less than 10 mm the substrate film preferably has a thickness of 1 to 100 μm, more preferably 10 to 70 μm, such as 40 to 60 μm.

The surface of the substrate is preferably of high planarity. High planarity in the context of the present invention means that the highest point on the surface is not more than 100 nm higher than the lowest point on the surface, preferably not more than 50 nm. The planarity can be measured with atomic force microscopy, preferably in tapping mode.

Substrates are often not available with high planarity, e.g. due to small scratches, or have particles such as dust adhered to their surface. It is therefore preferred if the barrier film further comprises a planarization layer to avoid damaging such as puncturing the laminate. More preferably the planarization layer is in between the substrate and the laminate. In this case the planarization layer can additionally serve to better hold together the substrate and the laminate, particularly upon bending or heating. Planarization layers can comprise organic polymers such as acrylates or epoxy, ceramics such as carbides, e.g. SiC, or organic-inorganic hybrid materials such as polyalkylsiloxanes. Organic polymers are preferred.

Often the planarization layer is made by depositing the material making up the planarization layer on the substrate before applying the laminate. In the case of organic polymers a liquid comprising a monomer is cast on the substrate and then cured, for example by heating or be UV initiation. UV initiation is preferred, more preferably the liquid comprising the monomer further comprises a curing aid such as a functionalized benzophenone. Preferably the liquid comprising the monomer comprises a mixture of mono- and difunctional monomers such that cross-linked organic polymers are obtained after curing. Planarization layers comprising ceramics are usually obtained by sputtering the material onto the substrate. Planarization layers comprising organic-inorganic hybrid materials can be obtained by casting a solution comprising an organic-inorganic precursor on the substrate, evaporating the solvent and condensing the organic-inorganic precursor, for example by heating. This process is often referred to as sol-gel process. An example for an organic-inorganic precursor is alkyl-trialkoxysilane. Preferably the precursor is functionalized with a UV curable side group, for example acrylate. In this way the organic-inorganic hybrid material can be cross-linked.

Preferably the material making up the planarization layer has a modulus of elasticity in between that of the substrate material and that of the laminate, for example 10 to 30 GPa. The method of determining the modulus of elasticity is described in ISO 527-1 (Plastics—Determination of tensile properties, 2012).

In the process according to the present invention the (semi)metal-containing compound or the organic compound in the gaseous state which are passed through separate orifices towards the surface of the substrate are not supposed to mix before they reach the substrate. To better suppress any mixing it is preferable that in between each two orifices through which an organic compound or a (semi)metal-containing compound is passed an orifice is placed through which an inert gas, such as nitrogen or argon, is passed towards the substrate. The flow rate of the inert gas is preferably set to a value at which the inert gas is in laminar flow. The flow rate thus depends amongst others on the size of the orifice, the distance of the orifice to the substrate and the inert gas used. The skilled person can calculate the Reynolds number for an inert gas in a given apparatus and thereby determine the maximum flow rate.

Preferably, an orifice through which a compound capable of decomposing the (semi)metal-containing compound is passed in the gaseous state towards the substrate is placed between each two orifices through which a (semi)metal-containing compound is passed towards the substrate. Compounds capable of decomposing the (semi)metal-containing compound include oxygen, ozone, a plasma like oxygen plasma, ammonia, oxidants like nitrous oxide or hydrogen peroxide, reducing agents like hydrogen, alcohols, hydrazine or hydroxylamine, or solvents like water. It is preferable to use oxidants, plasma or water to convert the (semi)metal-containing compound to a (semi)metal oxide. Exposure to water, an oxygen plasma or ozone is preferred. Exposure to water is particularly preferred. If it is desired to convert the (semi)metal-containing compound to elemental (semi)metal it is preferable to use reducing agents. If it is desired to convert the (semi)metal-containing compound to (semi)metal nitrides it is preferable to use ammonia or hydrazine.

Preferably more orifices through which a (semi)metal are passed towards the substrate are present than orifices through which an organic compound is passed. In this way any point on the surface of the substrate is hit by a stream of (semi)metal-containing compound more often than by a stream of organic compounds.

According to the present invention the orifices are mounted on a rotating drum. FIG. 1 shows an example of such a setup. Several orifices are mounted on a rotating drum (6): orifices through which an organic compound is passed (2), orifices through which a (semi)metal-containing compound is passed (3), orifices through which an inert gas is passed (4), and orifices through which a compound capable of decomposing the (semi)metal-containing compound is passed (5). The substrate can either be immobile or be moved. In case the substrate is flexible an organic-inorganic substrate can thus be deposited on a large substrate in a so-called roll-to-roll process.

Preferably each orifice passes the same surface area of the substrate at least twice. This can for example be realized by moving the substrate relative to the orifices back and forth at least twice, by rotating the substrate for at least two turns or by rotating the drum by at least two full rotations. More preferably, each orifice passes the same surface area of the substrate at least 10 times, even more preferably at least 30 times, in particular at least 100 times.

The process according to the present invention can be done at various pressures. This pressure refers to the pressure at the substrate while it can be different at the orifices or at a reservoir. Preferably the pressure at the substrate is 100 to 5000 mbar, more preferably 500 to 1500 mbar, in particular the pressure is atmospheric pressure or about atmospheric pressure. The temperature at which the process according to the present invention is done usually ranges from 20 to 200° C., preferably 50° C. to 150° C., in particular 80 to 120° C.

The process according to the present invention yields laminates with low permeability for small molecules like water and oxygen and with high flexibility. A good measure for the permeability for small molecules is the water vapor transmission rate (WVTR). It is preferably measured by evaporating an array of calcium dots onto the laminates and depositing another laminate on top of the calcium dots. These samples are then exposed to warm humid air, for example at 30 to 100° C. at 30 to 90% relative humidity, preferably at 60 to 80° C. at 60 to 80% relative humidity. This exposure is usually done for 100 to 1000 hours, preferably 200 to 600 hours, in particular 300 to 500 hours. The number of calcium dots which have turned transparent is used to calculate the WVTR as described by Paetzold et al. (Review of Scientific Instruments 74 (2003) 5147-5150). Generally, a laminate is regarded as having a low permeability for small molecules if the WVTR is smaller than $10^{-2}$ g/m$^2$d, preferably $10^{-4}$ g/m$^2$d, more preferably $10^{-5}$ g/m$^2$d, in particular $10^{-6}$ g/m$^2$d.

With the process according to the present invention laminates are available of high uniformity at large areas with low diffusion of small molecules even if bent. These laminates can be made at high speed and hence low cost.

EXAMPLES

Example 1

A barrier film was made using a PET substrate with a width of 30 cm and a thickness of 125 µm. The PET substrate was mounted to a roll to roll system with a foil tension of 18-22 N. The deposition of a laminate was performed by a rotating drum with a diameter of 30 cm placed in a chamber in which the temperature can be controlled. The deposition was performed at 104-106° C. while the rotating drum rotated at 0.2 Hz. The substrate was conveyed on a nitrogen gas bearing which was kept at 50 mbar corresponding to a gas flow of 225 standard liters per minute (slm) in the used equipment. The drum was equipped with 12 orifices with slot shape through which gaseous precursors were passed towards the surface of the substrate. The orifices were surrounded by smaller circular orifices through which nitrogen was passed towards the surface of the substrate.

Trimethylaluminum (TMA) was kept at room temperature in a container and water was kept in a controlled evaporator mixer. The respective vapors were alternatingly supplied to the slot-shaped orifices in the rotating drum. The TMA flow was set to 1 slm and diluted with 60 slm nitrogen. The water flow was set to 80 g/h and diluted with 25 slm nitrogen. The surface of the substrate was exposed to the gas flows from the rotating drum for 5 s. After this the drum was purged by passing nitrogen through the orifices for 10 s. Then, only TMA was passed through the slot-shaped orifices as described above for 2 s followed by a nitrogen purge of 10 s, where-upon a container with 4-mercaptophenol (4MP) at 120° C. was connected to the slot-shaped orifices while setting the 4MP vapor flow to 2 slm diluted by 25 slm nitrogen for 10 s after which the drum was purged by passing nitrogen through the orifices for 10 s.

The above described sequence is denoted by [[TMA-H$_2$O]$_{5s}$-TMA$_{2s}$-4MP$_{10s}$]. This sequence was consecutively performed 75 times. A laminate with a thickness of approximately 110-140 nm was obtained.

The invention claimed is:

1. A process for producing an organic-inorganic laminate, the process comprising:
    moving a substrate relative to at least two separate orifices mounted on a rotating drum, wherein rotating the drum moves the at least two separate orifices, and arranged along a relative moving trajectory,
    passing an organic compound comprising a thiophenol derivative in the gaseous state through at least one orifice towards the surface of the substrate to form an organic layer; and
    passing a (semi)metal-containing compound in the gaseous state through at least one other orifice, which is separated from the at least one orifice, towards the surface of the substrate to form an inorganic layer,
    wherein more orifices through which the (semi)metal-containing compound is passed towards the substrate are present than orifices through which the organic compound is passed such that any point on the surface of the substrate is hit by a stream of the (semi)metal-containing compound more often than by a stream of the organic compound; and
    wherein the passing of the organic compound and the passing of the (semi)metal-containing compound is repeated at least 10 times.

2. The process according to claim 1, further comprising passing an inert gas through an orifice towards the substrate, the orifice being placed between two orifices through which the organic compound or the (semi)metal-containing compound is passed.

3. The process according to claim 1, further comprising passing a compound capable of decomposing the (semi)metal-containing compound in the gaseous state through an orifice towards the substrate, the orifice being placed between two orifices through which the (semi)metal-containing compound is passed towards the substrate.

4. The process according to claim 1, wherein the speed of motion of the orifices relative to the substrate is 0.01 to 10 m/s.

5. The process according to claim 1, wherein the flow rate of the organic compound or the (semi)metal-containing compound through the orifices is 1 to 100 sccm.

6. The process according to claim 1, wherein the substrate is a polymer film.

7. The process according to claim 1, wherein each orifice passes the same surface area of the substrate at least twice.

8. The process according to claim 1, wherein the pressure at the substrate is 500 to 1500 mbar.

9. The process according to claim 1, wherein the temperature at the substrate is 50 to 150° C.

10. The process according to claim 1, wherein the (semi)metal-containing compound is an alkyl (semi)metal.

11. The process according to claim 3, wherein the compound capable of decomposing the (semi)metal-containing compound is water, an oxygen plasma, or ozone.

12. The process according to claim 1, wherein the organic compound comprises 4-mercaptophenol or 4-mercaptobenzylic alcohol.

13. The process according to claim 1, wherein the laminate has a water vapor transmission rate (WVTR) of less than $10^{-2}$ g/m$^2$d.

14. The process according to claim 13, wherein the WVTR is less than $10^{-6}$ g/m$^2$d.

15. The process according to claim 1, wherein the laminate has a thickness of approximately 110 nm to 140 nm.

16. The process according to claim 1, wherein the (semi)metal-containing compound comprises trimethylaluminum and the organic compound comprises 4-mercaptophenol.

* * * * *

UNITED STATES PATENT AND TRADEMARK OFFICE
CERTIFICATE OF CORRECTION

| | | |
|---|---|---|
| PATENT NO. | : 11,639,549 B2 | Page 1 of 1 |
| APPLICATION NO. | : 15/317594 | |
| DATED | : May 2, 2023 | |
| INVENTOR(S) | : Ahlf et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 419 days.

Signed and Sealed this
Seventh Day of January, 2025

Derrick Brent
*Acting Director of the United States Patent and Trademark Office*